(12) United States Patent
D'Amore et al.

(10) Patent No.: US 11,594,955 B2
(45) Date of Patent: *Feb. 28, 2023

(54) CURRENT AVERAGING AUDIO AMPLIFIER

(71) Applicant: D'Amore Engineering, LLC, Camarillo, CA (US)

(72) Inventors: Anthony T. D'Amore, Camarillo, CA (US); Juan Rodriguez, Camarillo, CA (US)

(73) Assignee: D'Amore Engineering, LLC, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/553,132

(22) Filed: Dec. 16, 2021

(65) Prior Publication Data
US 2022/0109367 A1 Apr. 7, 2022

Related U.S. Application Data

(63) Continuation of application No. 17/179,496, filed on Feb. 19, 2021, now Pat. No. 11,205,955, which is a continuation-in-part of application No. 16/906,139, filed on Jun. 19, 2020, now abandoned.

(51) Int. Cl.
| | |
|---|---|
| H02J 7/00 | (2006.01) |
| H02M 3/04 | (2006.01) |
| G06F 3/16 | (2006.01) |
| H04R 3/00 | (2006.01) |
| H03F 3/181 | (2006.01) |
| B60R 16/033 | (2006.01) |

(52) U.S. Cl.
CPC ............. *H02M 3/04* (2013.01); *B60R 16/033* (2013.01); *G06F 3/165* (2013.01); *H02J 7/0068* (2013.01); *H03F 3/181* (2013.01); *H04R 3/00* (2013.01); *H03F 2200/03* (2013.01); *H04R 2499/13* (2013.01)

(58) Field of Classification Search
CPC ................ H02J 7/0068; H02J 2207/20; H04R 2499/13; B60R 16/033
USPC ....................................................... 307/10.6
See application file for complete search history.

(56) References Cited

U.S. PATENT DOCUMENTS

| | | | |
|---|---|---|---|
| 5,444,867 | A | 8/1995 | Marui |
| 5,591,212 | A | 1/1997 | Keimel |
| 5,844,792 | A | 12/1998 | Moreau |
| 6,061,577 | A | 5/2000 | Andrieu |

(Continued)

*Primary Examiner* — Michael R. Fin
(74) *Attorney, Agent, or Firm* — Neustel Law Offices

(57) ABSTRACT

A current-averaging audio amplifier for vehicles. The current averaging audio amplifier is connectable to a DC power source and a load, and may generally comprise a power input to receive a DC electrical power from the DC power source. The system may further include a voltage converter, such as a boost converter, connected to the power input, such that the voltage converter can receive electrical power from the DC power source. The system also includes a rechargeable battery coupled to the voltage converter, such that the voltage converter charges the rechargeable battery. An audio amplifier can be powered by the rechargeable battery and connectable to supply power to the load, wherein the average power supplied by the rechargeable battery to the audio amplifier in a finite time interval differs from the average power supplied by the DC power source to the voltage converter.

17 Claims, 16 Drawing Sheets

(56) References Cited

U.S. PATENT DOCUMENTS

| | | | |
|---|---|---|---|
| 6,831,519 B2 | 12/2004 | Bar-David | |
| 6,836,097 B2 | 12/2004 | Turner | |
| 6,978,177 B1 | 12/2005 | Chen | |
| 7,170,764 B2 | 1/2007 | Vinciarelli | |
| 7,239,206 B2 * | 7/2007 | D'Amore | H03F 3/20 330/297 |
| 7,656,061 B2 | 2/2010 | Litovsky | |
| 8,212,620 B2 | 7/2012 | Strickland | |
| 8,604,752 B2 | 12/2013 | Cole, Jr. | |
| 9,209,767 B1 * | 12/2015 | Svendsen | H03G 3/004 |
| 9,225,302 B2 | 12/2015 | Dakshinamurthy | |
| 9,438,181 B1 * | 9/2016 | Baker | H03F 1/0222 |
| 9,906,192 B2 | 2/2018 | Lee | |
| 2003/0169022 A1 | 9/2003 | Tucker | |
| 2004/0036499 A1 | 2/2004 | Bal | |
| 2006/0221516 A1 | 10/2006 | Daboussi | |
| 2010/0244788 A1 * | 9/2010 | Chen | H02M 3/1584 323/234 |
| 2015/0200640 A1 * | 7/2015 | Hogan | H03G 3/004 381/108 |
| 2016/0294205 A1 | 10/2016 | Zimnicki | |
| 2018/0115246 A1 | 4/2018 | Azrai | |
| 2018/0152781 A1 | 5/2018 | Boyer | |
| 2019/0190371 A1 | 6/2019 | Piccardi | |

* cited by examiner

CURRENT AVERAGING AUDIO AMPLIFIER

CROSS REFERENCE TO RELATED APPLICATIONS

The present application is a continuation of U.S. application Ser. No. 17/179,496 filed on Feb. 19, 2021 which issues as U.S. Pat. No. 11,205,955 on Dec. 21, 2021, which is a continuation-in-part of U.S. application Ser. No. 16/906,139 filed on Jun. 19, 2020 which is now abandoned. Each of the aforementioned patent applications, and any applications related thereto, is herein incorporated by reference in their entirety.

STATEMENT REGARDING FEDERALLY SPONSORED RESEARCH OR DEVELOPMENT

Not applicable to this application.

BACKGROUND

Field

Example embodiments in general relate to a current averaging audio amplifier System for providing improved power output for use in vehicles, such as vehicles with limited electrical power systems.

Related Art

Any discussion of the related art throughout the specification should in no way be considered as an admission that such related art is widely known or forms part of common general knowledge in the field.

Amplifiers for providing audio in vehicles, including vehicles with more limited electrical power systems, have been in use for many years. Due to the dynamic nature of music, systems that rely on a vehicle's electrical system may cause problems with such systems when high current is required. For example, reproducing musical peaks can require up to ten times more current than the average current demand on an audio system's power supply over a longer time interval. Currently, such peaks must be supplied by a vehicle's electrical system, which can be problematic, especially for smaller vehicles with limited electrical power, although high peak current demand can also cause problems in other vehicles.

SUMMARY

An example embodiment is directed to a current averaging audio amplification system that is connectable to a DC power source and a load, and may generally comprise a power input adapted to receive a DC electrical power from the DC power source, which may be the power source of a vehicle, such as a recreational vehicle. The DC electrical power comprises a DC input voltage. The system may further include a voltage converter, which may be a boost converter, the voltage converter comprising an output and being connected to the power input, such that the voltage converter can receive electrical power from the DC power source, wherein the voltage converter produces a DC output voltage at the output.

The system also includes a rechargeable battery coupled to the output of the voltage converter, such that the voltage converter charges the rechargeable battery, and an audio amplifier that is powered by the rechargeable battery and connectable to supply power to the load, wherein the average power supplied to the audio amplifier in a finite time interval differs from the average power supplied by the DC power source to the power input of the voltage converter. Further, the audio amplifier can be simultaneously powered by the voltage converter and the rechargeable battery. In such cases, the voltage converter and the rechargeable battery will typically share the current (and thus the power) that is supplied to the amplifier.

Because the use of a voltage converter and a rechargeable battery creates a lower, long-term average current draw from the DC power source, this system can remove the peak current requirements from a vehicle's electrical system, whereas in prior systems, musical peaks can require up to ten times more current than the average current demand on the vehicle's electrical system.

In some example embodiments, the voltage converter draws current-limited power from the DC power source, and further, the DC output voltage of the voltage converter may comprise a regulated voltage. The voltage converter may have current limiting circuitry, and may further be adapted to receive a user input (i.e., an input that is manually adjustable by a user, as opposed to a designed-in and fixed current limit) current limit set point. In high-load conditions, the voltage converter can supply current and power to the audio amplifier up to the manually adjustable current limit set point, and the rechargeable battery can supply current drawn by the audio amplifier to the extent that the current exceeds the current limit set point.

In example embodiments where the voltage converter is a boost converter, the voltage output of the rechargeable battery will typically be greater than the DC input voltage from the DC power source. Further, the average power supplied to the audio amplifier by the rechargeable battery in the finite time interval is greater than the average power supplied by the DC power source to the power input of the voltage converter, typically when the finite time interval is short. Moreover, the average power supplied to the audio amplifier in the finite time interval can also be less than the average power supplied by the DC power source to the power input of the voltage converter, typically when the finite time interval is long (relative to the above-referenced "short" interval).

In some example embodiments, the audio amplifier comprises a power input that is directly connected to the rechargeable battery, and the rechargeable battery can be connected in parallel with the output of the voltage converter so that the converter and the battery can both supply power and current to the audio amplifier via a direction connection to the power input of the audio amplifier. In other embodiments, the system may include a second voltage converter, typically a boost converter, coupled to and receiving power from the rechargeable battery, the second, boost converter coupled to provide power to the audio amplifier, wherein the power provided to the audio amplifier has a DC voltage greater than a voltage of the rechargeable battery. The second boost converter may be a single stage converter, or it may comprise multiple boost stages connected in series, parallel, or any combination of such connections.

In addition to different currents, over any finite time interval, the power used by the amplifier or delivered to the load can differ from the power, such as the average power, supplied by the DC power source to the amplification system. For example, the average power supplied to the audio amplifier in the finite time interval can be greater than the average power supplied by the DC power source to the power input of the voltage converter, typically when the finite time interval is short. Moreover, the average power supplied to the audio amplifier in the finite time interval can also be less than the average power supplied by the DC power source to the power input of the voltage converter, typically when the finite time interval is long (relative to the above-referenced "short" interval).

In some example embodiments of the audio amplification system, the voltage converter, the rechargeable battery, the boost converter and the audio amplifier may be contained in a single, mechanical enclosure, which may be a weatherproof or waterproof (or water resistant) enclosure. In other embodiments, the voltage converter and the rechargeable battery may be contained in a single enclosure of the type discussed above. In addition, the rechargeable battery may have a large capacity, such that it can power the amplifier for an hour or more, or for an extended time period, without connection to the DC power source. This allows for the audio amplification system to be disconnected from a vehicle and used as a portable, detachable audio system that can be used beyond the vehicle. To accomplish this, the audio amplification system can be made with connectors or a connection that can be easily and quickly disconnected from a vehicle's power system, and further, the enclosure may be made for easy carrying and physical disconnection from the vehicle as well.

Still other embodiments may include a method of using an audio amplification system of any configuration, including those mentioned above and herein, the method comprising receiving current from a DC power source at the voltage converter; using the voltage converter output to provide a charging current to the rechargeable battery; using power from the rechargeable battery to provide power to the audio amplifier; receiving an input signal at the audio amplifier; amplifying the input signal using the audio amplifier; and providing the amplified input signal to the load, wherein the power supplied to the load by the audio amplifier can exceed the power supplied by the DC power source for a finite period of time.

Other embodiments of the method may further include using power from the rechargeable battery to provide power to second voltage converter, such as a boost converter, and then providing power from the second boost converter to the audio amplifier.

There has thus been outlined, rather broadly, some of the embodiments of the current averaging audio amplifier in order that the detailed description thereof may be better understood, and in order that the present contribution to the art may be better appreciated. There are additional embodiments of the current averaging audio amplifier that will be described hereinafter and that will form the subject matter of the claims appended hereto. In this respect, before explaining at least one embodiment of the current averaging audio amplifier in detail, it is to be understood that the current averaging audio amplifier is not limited in its application to the details of construction or to the arrangements of the components set forth in the following description or illustrated in the drawings. The current averaging audio amplifier is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Example embodiments will become more fully understood from the detailed description given herein below and the accompanying drawings, wherein like elements are represented by like reference characters, which are given by way of illustration only and thus are not limitative of the example embodiments herein.

DETAILED DESCRIPTION

Figure 1:
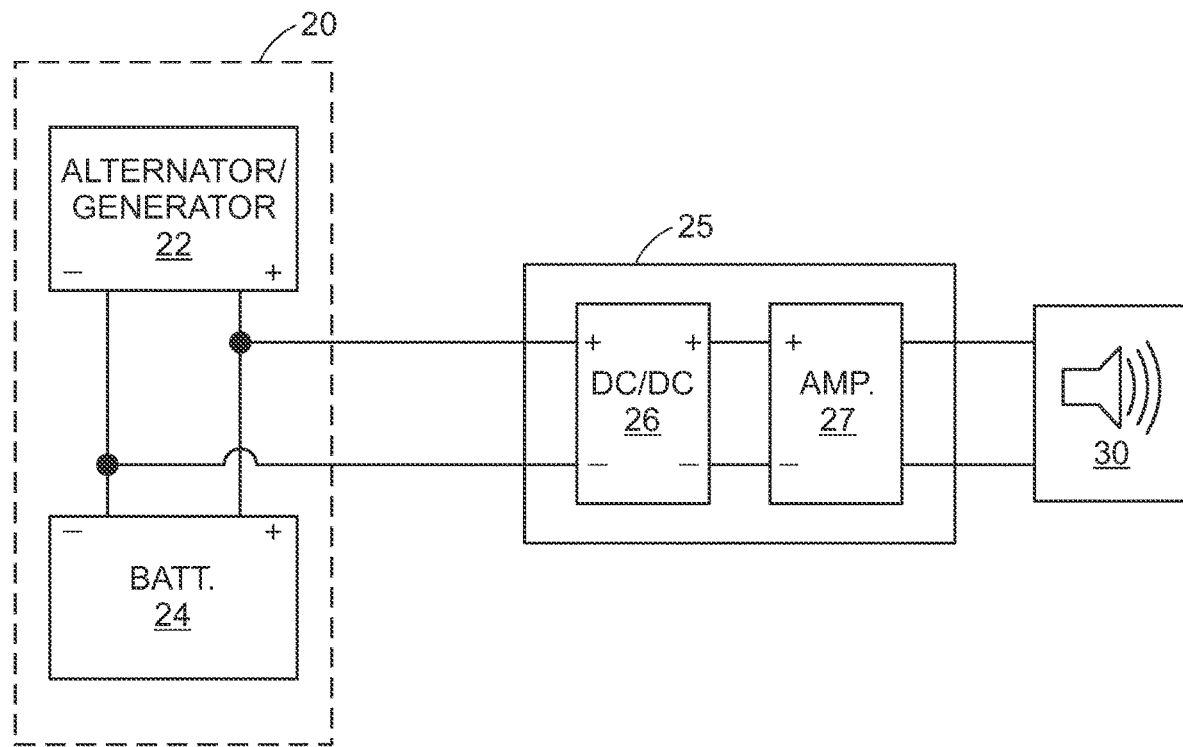
FIG. 1 is a block diagram of a prior art audio amplification system for use in a vehicle.

A. Overview.

An example current averaging audio amplifier system 10 is connectable to a DC power source 20 and a load 30, and may generally comprise a power input 42 adapted to receive a DC electrical power from the power source 20, which may be a DC power source, and may also be the power source of a vehicle, such as a recreational vehicle. If so, the power source 20 may comprise an alternator or generator 22 and a storage battery 24. The DC electrical power comprises a DC input voltage. The system further may include a voltage converter 40, which may be a DC/DC boost converter, the voltage converter 40 comprising an output 43 and being connected to the power input 42, such that the voltage converter 40 can receive electrical power from the DC power source 20, wherein the voltage converter 40 produces a DC output voltage at the output 43.

The system also includes a rechargeable battery 50 coupled to the output 43 of the voltage converter 40, such that the voltage converter 40 charges the rechargeable battery 50, and the audio amplifier system 10 also includes an audio amplifier 60 that is powered by the rechargeable battery 50 and the voltage converter 40 (the rechargeable battery 50 and the voltage converter 40 may be connected by a direct, parallel connection—i.e., with no intervening components between the output of the voltage converter 40 and the rechargeable battery 50), and is also connectable to supply power to the load 30, wherein the average power supplied to the audio amplifier 60 by the rechargeable battery 50 and the voltage converter 40 in a finite period of time differs from the average power supplied by the DC power source 20 to the power input 42 of the voltage converter 40 during the same finite period of time.

In some example embodiments, the voltage converter 40 draws current-limited power from the DC power source 20, and further, the DC output 43 of the voltage converter 40 may comprise a regulated voltage.

In example embodiments where the voltage converter 40 (which may also be referred to as a first voltage converter in embodiments where a second boost converter is used) is a boost converter, the voltage output 44 of the rechargeable battery 50 will typically be greater than the DC input voltage from the DC power source 20. Further, the average power supplied to the audio amplifier 60 in the finite time interval, in order to adequately power the load 30, is greater than the average power supplied by the DC power source 20 to the power input 42 of the voltage converter 40, typically when the finite time interval is short. Moreover, the average power supplied to the audio amplifier 60 by the rechargeable battery 50 and the voltage converter 40 in the finite time period can also be less than the average power supplied by the DC power source 20 to the power input 42 of the voltage converter 40, typically when the finite time period is long (relative to the above-referenced "short" interval).

In some example embodiments, the audio amplifier 60 comprises a power input 64 that is directly connected to the rechargeable battery 50 and further, since the voltage converter 40 can be connected in parallel to the battery 50, the amplifier power input 64 is also directly connected to the output of voltage converter 40. In other embodiments, the system may include a second DC/DC voltage converter 80, typically a boost converter, coupled to and receiving power from the rechargeable battery 50, the second, boost converter 80 coupled to provide power via output 85 to the audio amplifier 60, wherein the power provided to the audio amplifier 60 has a DC voltage greater than a voltage of the rechargeable battery 50. The second boost converter 80 may be a single stage converter, or it may comprise multiple boost stages connected in series, parallel, or any combination of such connections.

In some example embodiments of the audio amplification system, the voltage converter 40, the rechargeable battery 50, the boost converter 80 and the audio amplifier 60 may be contained in a single, mechanical enclosure 90, which may be a weatherproof or waterproof (or water resistant) enclosure. In other embodiments, the voltage converter 40 and the rechargeable battery 50 may be contained in a single enclosure 90 of the type discussed above. Either type of enclosure may be made to be detachable, so that the rechargeable battery can power the audio amplifier 60 outside of a vehicle, and as discussed above, the rechargeable battery 50 can be sized so that it can power the audio amplifier 60 for hours, or for an extended period of time, without being powered by a vehicle's battery or other DC power source.

B. Voltage Converter.

Figure 2:
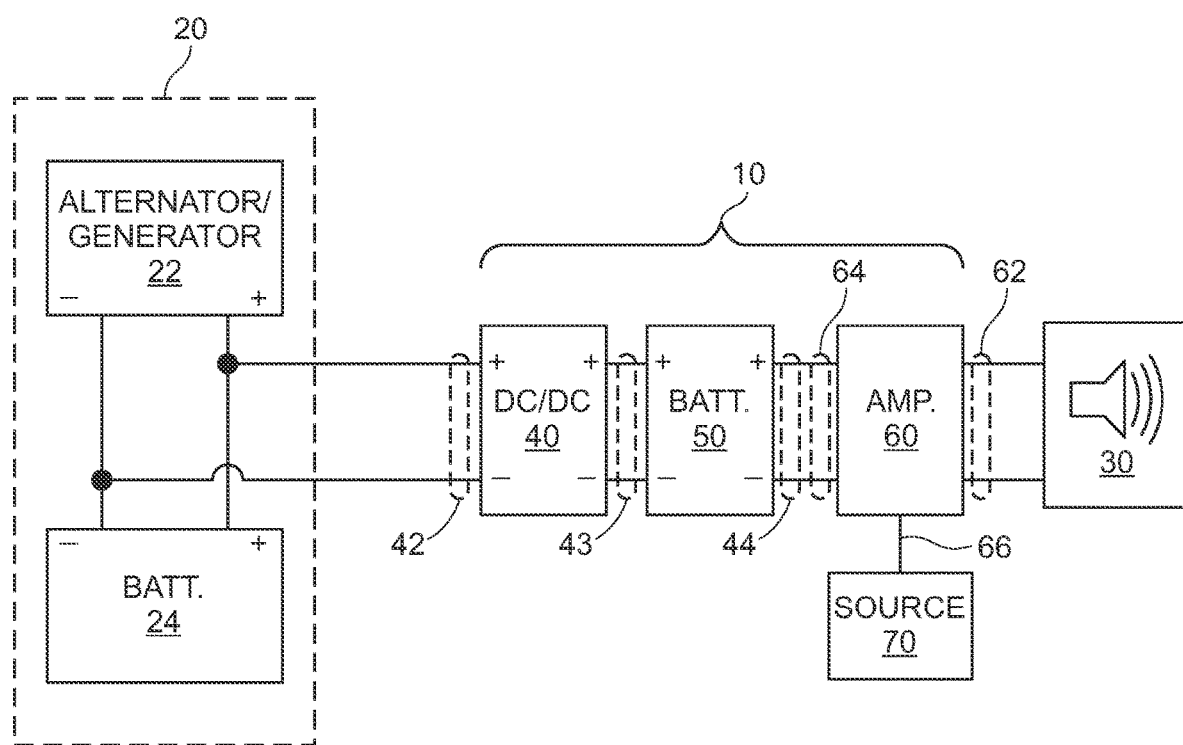
FIG. 2 is a block diagram of a current averaging audio amplifier system in accordance with another example embodiment.
Figure 3:
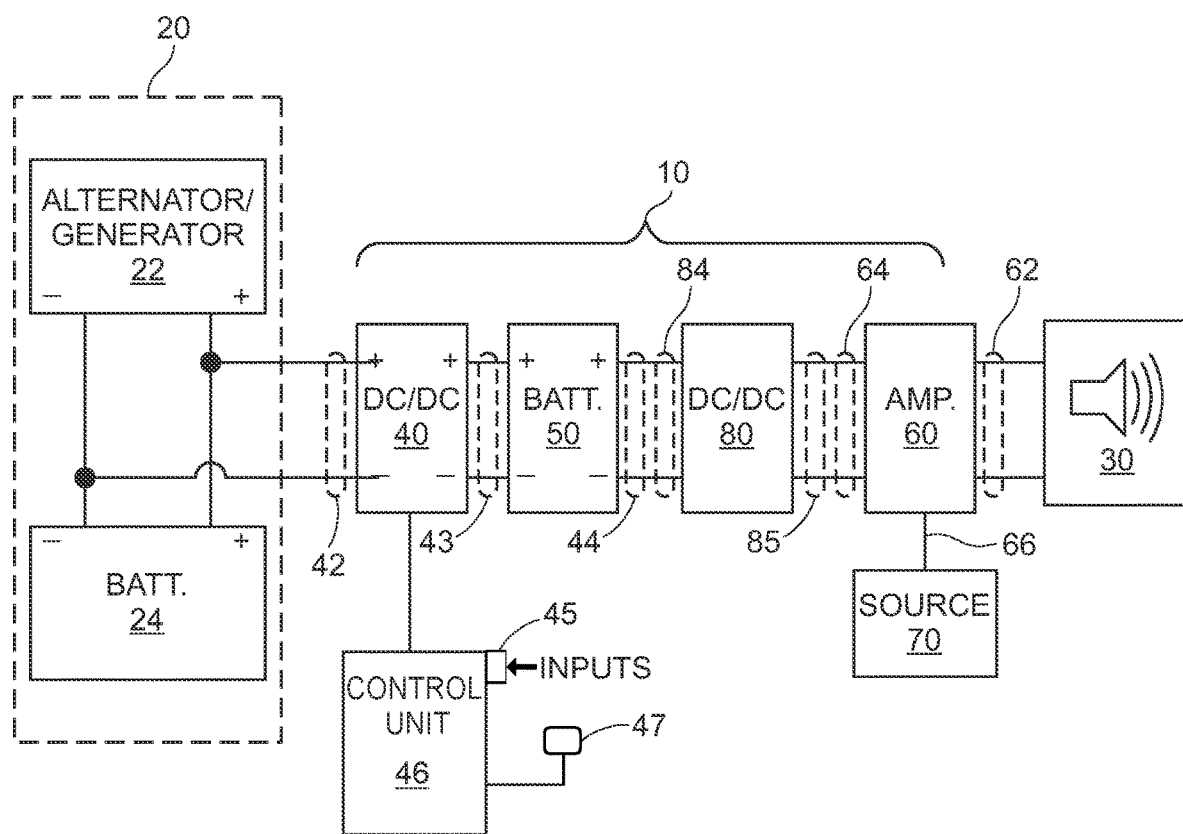
FIG. 3 is another block diagram of a current averaging audio amplifier system in accordance with an example embodiment.

As discussed above, the system 10 may generally include a power input 42 that receives DC electrical power from the power source 20, such as the power source of a vehicle. The basic connection of these components is shown in FIGS. 2-4 (including 4A-4D). The power source 20 may have an alternator 22 connected to charge a storage battery 24. The power source 20 provides an input voltage, such as a DC voltage, to power input 42. This power input is provided to voltage converter 40, which may be a DC/DC boost converter. The voltage converter 40 may have an output 43 that is connected to battery 50, such that the converter 40 charges rechargeable battery 50.

The voltage converter 40 is current limited, and may have a regulated output 43, so that regardless of the demands of the audio amplifier 60, the converter 40 will draw a continuous current or a limited current (depending on the charge level of rechargeable battery 50) from the power source 20 and/or vehicle battery 24. The voltage converter provides its output current to the audio amplifier such that the voltage converter does not draw current from the DC power source in excess of the current limit set point. The voltage converter 40 also provides some of its output current to the rechargeable battery 50. The current draw of converter 40 can be selected by design or can be manually input by a user, with the only requirement being that the long-term average power delivered from power source 20 to battery 50 meets the average power needs of amplifier 60, as discussed in detail below. As is known, as rechargeable battery 50 becomes fully charged, the power and current supplied by vehicle battery 24 to the amplification system 10 will fall, and may be or approach zero, especially if demands on amplifier 60 are small at a particular time.

Thus, the first DC/DC converter 40 functions essentially as a battery charger, and may in example embodiments be a battery charger, and it may also provide for electrical isolation between the vehicle's power source 20 and the amplifier system's power supply, which comprises the voltage converter 40 and rechargeable battery 50, but may include an additional boost converter or multiple additional converters. The voltage converter 40 may share a common ground with the vehicle.

In addition, the DC/DC converter 40 may include, or be controlled by, a control unit 46, which may include a microprocessor and appropriate interface circuitry to receive inputs from various sensors at control unit input/output interface 45 to monitor the state of charge or temperature of rechargeable storage battery 50, incoming voltage from the power source 20 and/or vehicle battery 24, inputs from other stages or circuits of the system 10, or environmental factors such as temperature. An example of this configuration is shown in FIG. 3. Sensors usable with control unit 46 can include, for example, temperature sensors, current sensors, voltage sensors or lead wires to conduct battery voltage to interface circuitry of the control unit 46 or DC/DC converter 40. The control unit 46 may also include or be connected to a user interface, via a wireless antenna 47 and wireless interface 110, or a wired interface 100 connected to input/output interface 45. The wired or wireless user interface allows a user to control the system 10, or part of it, for example, by manually entering, changing, or adjusting a current limit set point. Thus, the control unit 46 may give a user the option to manually select the maximum allowable current input from the power source 20 and/or vehicle battery 24, or the current limit set point can be set "intelligently" by programming of the microprocessor using any or all of the above inputs to determine an optimal or efficient current limit level. The current level may optimize charge conditions and protect the vehicle battery 24, the power source 20 and the rechargeable storage battery 50.

Figure 11:
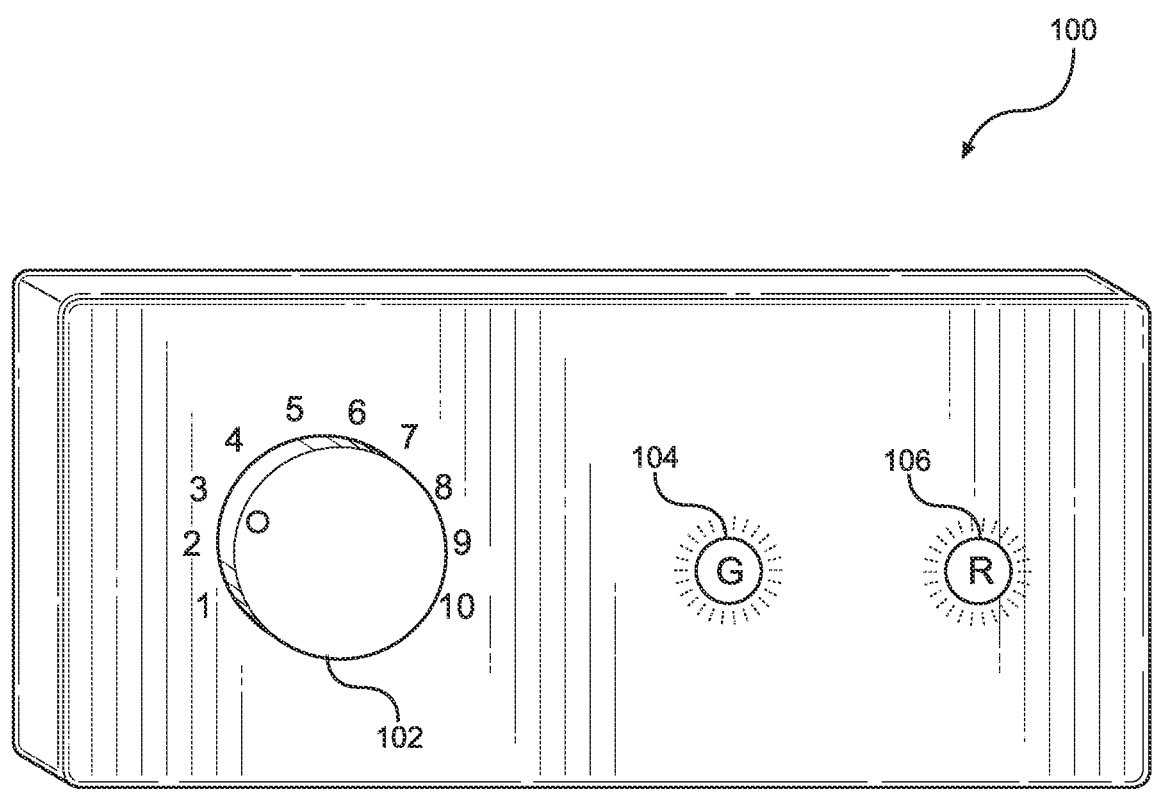
FIG. 11 is a perspective view of a user input device usable in accordance with an example embodiment.
Figure 14:
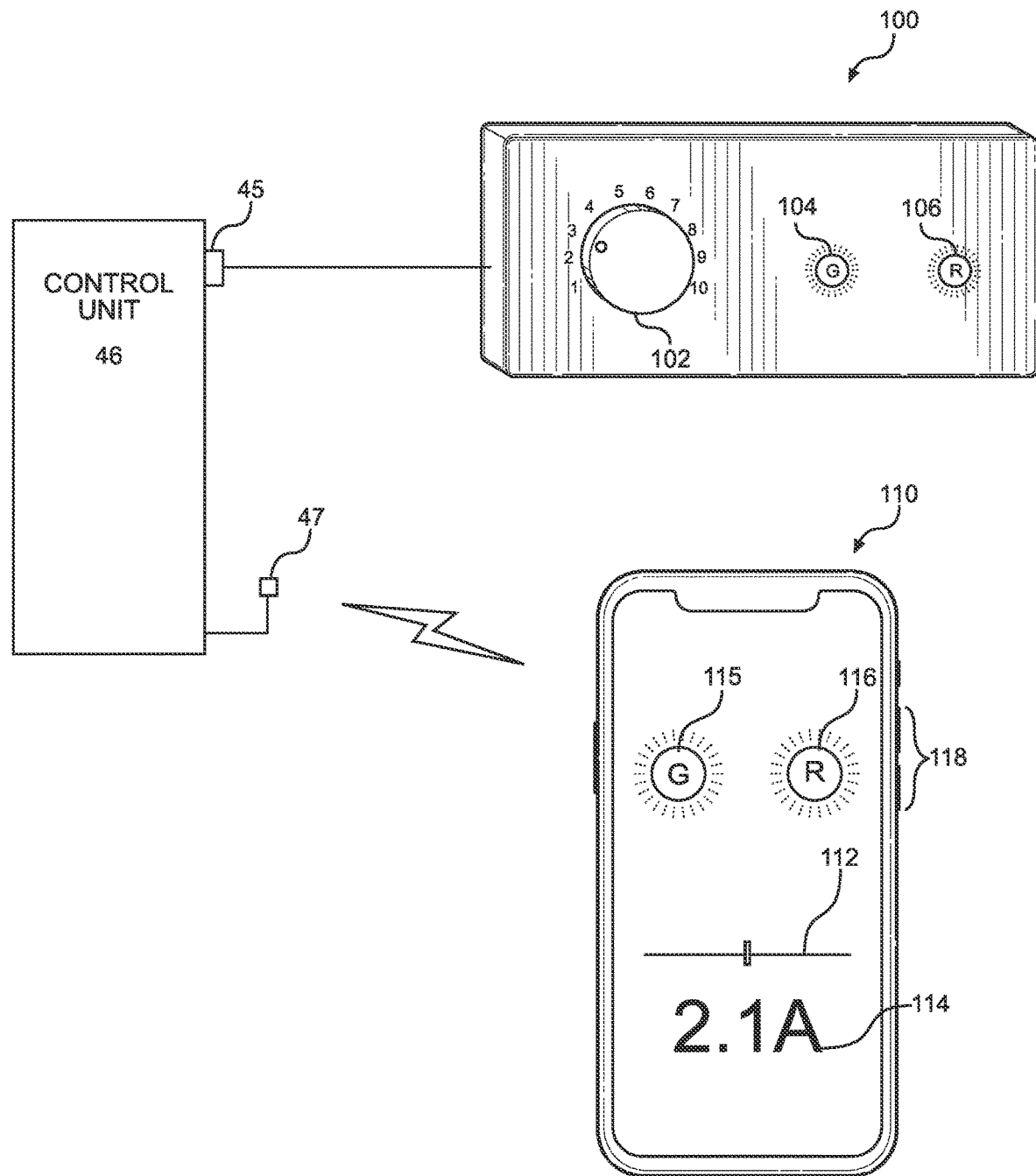
FIG. 14 is a block diagram illustrating inputs to a current averaging audio amplifier system in accordance with an example embodiment.

An example wired interface 100 is shown in FIGS. 11 and 14. The wired interface 100 may include a control 102 for manually adjusting the current limit set point of the voltage converter 40. The wired interface 100 shown has fixed indicators for the current level, but a digital or multi-segment display may also be used. In the example shown, the unit indicators are in amperes, and represent the maximum current that the voltage converter will draw from a vehicle's electrical system, or other DC power source. The wired interface 100 may provide an analog or digital signal to control unit 46, which may be appropriately stored and used for the manually adjustable current limit set point. The wired interface 100 may be connected to control unit 46 at input/output interface 45, as shown in FIG. 14.

Figure 12:
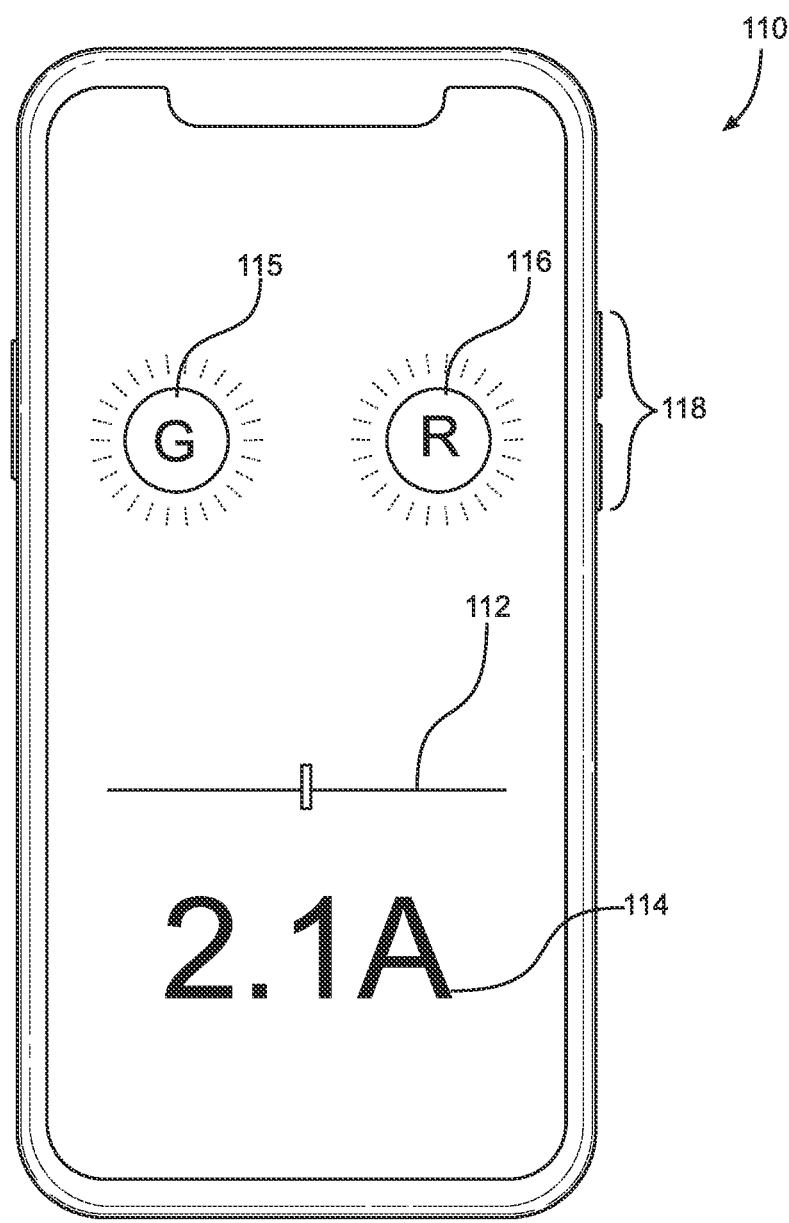
FIG. 12 is a front view of another user input device usable in accordance with an example embodiment.
Figure 13:
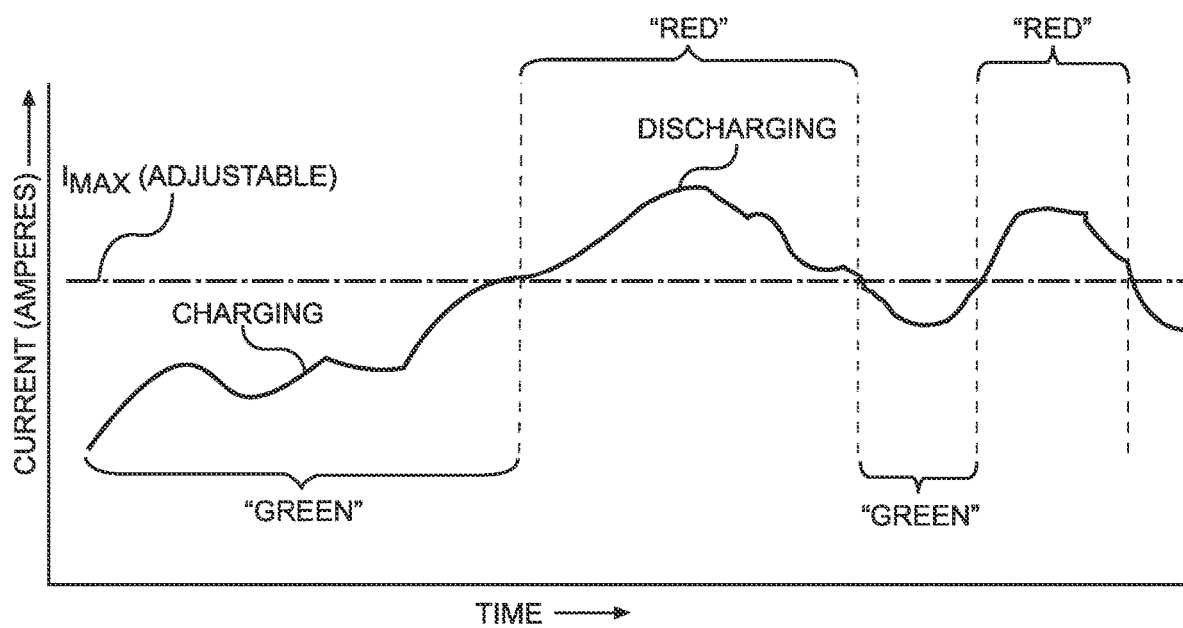
FIG. 13 is a diagram illustrating charge and discharge conditions in a current averaging audio amplifier system in accordance with an example embodiment.

In addition to provide a means for a user to provide a manual current input to establish a set point, wired interface 100 may also include a charge indicator 104, (or 115) which will typically provide a charge visual indication in substantially real time (i.e., as fast as a signal can be electronically converted, either using digital or analog techniques) to indicate that rechargeable battery 50 is being charged by voltage converter 40. The charge indicator 104 may be a green LED, and it may also comprise other components, such as lights or display portions, as indicated by charge indicator 115 in FIGS. 12 and 14. As shown in FIG. 13, this charge visual indication will be "ON" (i.e., "GREEN") when the current indicated by the curve being drawn by the audio amplifier 60 is less than the current that the voltage converter 40 can deliver when it is drawing current from DC power supply 20 below the current set point, indicated as $I_{MAX}$ in FIG. 13.

Figure 15:
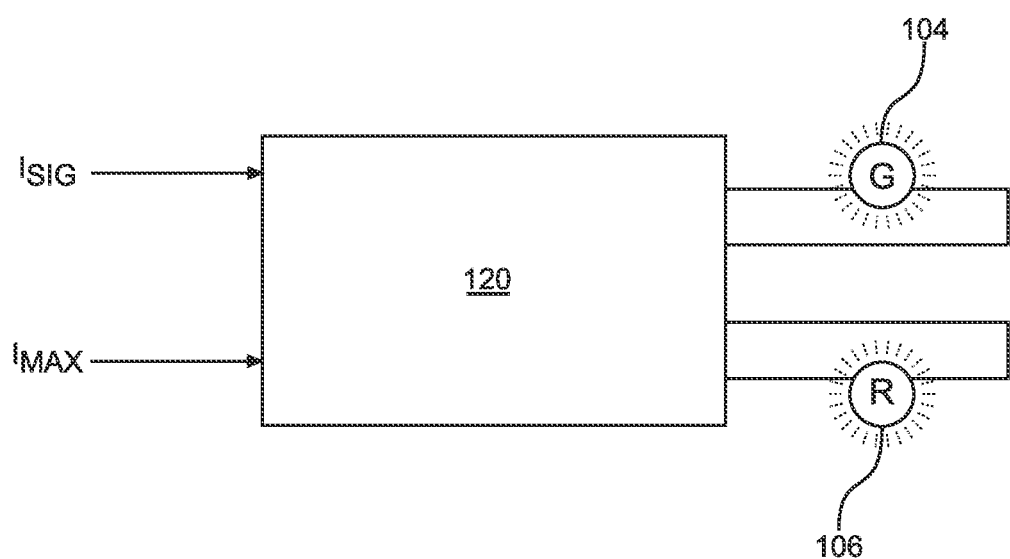
FIG. 15 is a block diagram illustrating charge and discharge detection and indicators in a current averaging audio amplifier system in accordance with an example embodiment.

The wired interface 100 may also include a discharge indicator 106, 116, such as a red LED, to provide a discharge visual indication in substantially real time to indicate that rechargeable battery 50 is being discharged by supplying current to audio amplifier 60 that is in excess of the current limit of voltage converter 40. For example, if the current limit set point of voltage converter 40 is set at 2.1 amperes, the charge indicator may be on when the current drawn by amplifier 60 is less than the current that can be supplied by voltage converter 40 when the input current is less than 2.1 amperes, and the discharge indicator will be on when the current drawn by amplifier 60 is more than the current that can be supplied by voltage converter 40 when the input current is limited at 2.1 amperes. As noted, the discharge indicator 106 may be a red LED, and it may also comprise other components, such as lights or display portions, such as indicator 116 in FIGS. 12 and 14. As shown in FIG. 13, the discharge visual indication will be "ON" (i.e., "RED") when the current (indicated by the curve) being drawn by audio amplifier 60 is more than the current that can be supplied by voltage converter 40 when it is supplied with current in the amount of the set point, indicated as $I_{MAX}$ in FIG. 13. A detector circuit 120, as shown in FIG. 15, may be used in association with current and voltage sensors in the system in order to compare, in substantially real time, a signal representative of the current (or power) drawn by amplifier 60 (e.g., $I_{SIG}$) to a signal representative of the maximum current that the voltage converter can deliver, as dictated by the set point (e.g., $I_{MAX}$) in order to appropriately drive charge indicator 104, 115 and discharge indicator 106, 116.

In addition to wired interface 100, a wireless interface 110 (see FIGS. 12 and 14) may be used to accomplish the functions described above, doing so via antenna 47 of control unit 46. The wireless interface 110 may communicate via Bluetooth, Wi-Fi, or other wireless signals. Wireless interface 110 may use a graphical representation as shown to simulate a hardware device. Specifically, it may include a graphical slider 112, which may be controlled by a user touching the display, and also by hardware buttons 118. The wireless interface 110 may also provide a digital representation 114 or possibly a simulated analog display showing the current set point. The wireless interface 110 may also include its own charge indicator 115 and discharge indicator 116, which can be shown, for example, by green and red representations on a screen or display. Further, even if a wireless interface 110 is used to adjust the current limit received by control unit 46 and provided to or implemented by voltage converter 40, the charge indicator 104 and the discharge indicator 106 or wired interface 100 (if present) may still be active, and may respond more quickly to indicate charge/discharge status.

For charge variations that may be made by a microprocessor or other circuitry in the control unit 46, factors relating to the battery type may be considered. The battery type may be accounted for in the programming or logic of the control unit, and it also may be manually changed by a user via a user interface 100 or 110. For example, for some battery types a partial charge is acceptable, and for others, a full charge is best. Also, for Lithium-ion (which may be used for rechargeable battery 50) or some other battery types, it may be desirable not to charge below freezing or above about 122° F., so the control unit may limit or reduce charging current under these conditions. Conditions for other types of batteries may also be accounted for. In addition to environmental temperature, as mentioned, the rechargeable storage battery 50 may have a temperature sensor included on the battery or its case, to provide an input to the control unit 46, such that the battery 50 is kept relatively cool or below a certain temperature, by removing, reducing, or tapering the charge as the battery 50 heats up or nears full charge.

It is possible that voltage converter 40 is a boost converter, which provides a higher voltage at its output 43 than the voltage it receives at its input 42. This allows the rechargeable storage battery 50 to have a higher nominal voltage than the vehicle's system battery 24. As is known, such a higher voltage is advantageous when driving a load, such as stereo speakers, from a vehicle system, because a vehicle's typical 12-volt system cannot drive high current into the load, simply due to the relationship between current, voltage, and impedance (i.e., ohm's law). In addition, if an amplifier's power supply voltage is just 12 volts, an input signal that calls for a transient output greater than 12 volts can result in clipping of the output.

The higher voltage output of the DC/DC converter 40 (if a higher voltage is used) can also contribute to the isolation of power between the vehicle system and the amplifier, such that the power, and especially the dynamic power, supplied to amplifier 60 can be different from the power supplied by the vehicle system 20 and vehicle battery 24 at the input 42.

C. Rechargeable Battery.

Figure 9:
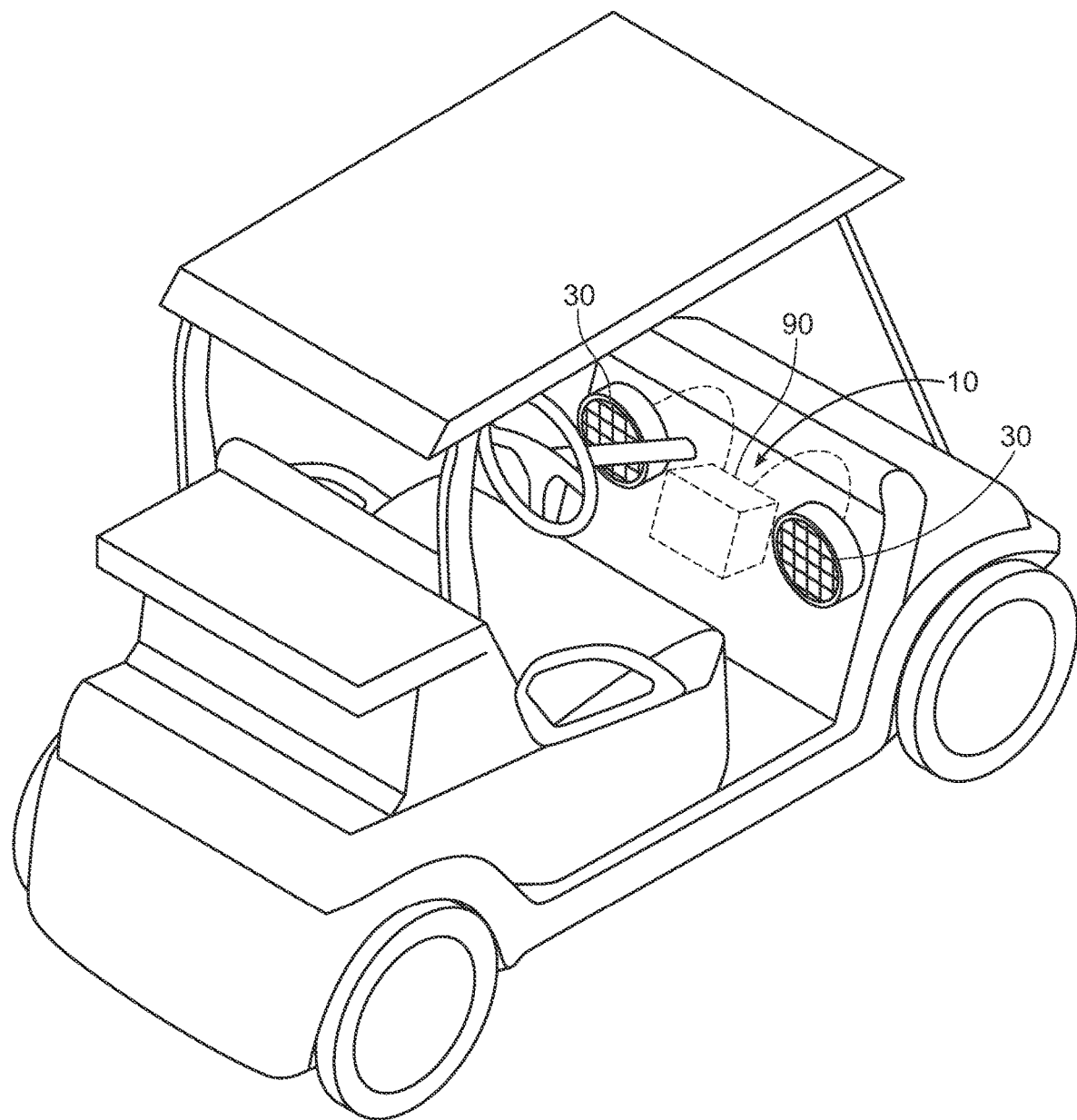
FIG. 9 is a perspective view of a current averaging audio amplifier system in use in accordance with an example embodiment.

As discussed above, the system 10 may also include a rechargeable battery 50 (i.e., a chemical/electrical battery, such as a lithium-ion battery) that is connected to and charged by DC/DC converter 40. This feature can be contrasted to the prior art shown for example in FIG. 1, which has a voltage converter but no second battery. Such a system may work for low power use, but can become problematic for vehicles, such as recreational vehicles, ATVs, boats, golf carts, hybrid vehicles, or sport utility vehicles, etc. Although usable with any type of vehicle, the amplifier system 10 may have particular utility in vehicles or applications with smaller, relatively low-capacity electrical systems 20, as will be explained further below. As one possible application, an example system 10 is represented in FIG. 9, as installed in a golf cart, with an enclosure 90. The output of the amplifier of the system 10 will typically be connected to drive speakers/load 30.

The cost of rechargeable batteries has declined recently, making systems such as those illustrated herein more economical, and having better performance, than other systems used to overcome the problems with audio systems such as that shown in FIG. 1. For example, one system that has been used to provide high transient power uses capacitors, ultra-capacitors, or a super capacitor bank, as shown and described in U.S. Pat. No. 7,239,206, issued to Anthony D'Amore on Jul. 3, 2007, which is hereby fully incorporated by reference.

The energy density of rechargeable batteries currently available is much higher than the best capacitors available, and as mentioned, the cost is also lower due to the extensive use of such batteries in electric vehicles. Although depicted in FIGS. 2-6 and 8 as a single unit, battery 50 may be comprised of any number of batteries connected in serial, parallel, or combinations thereof to achieve the capacity and voltage desired. The rechargeable battery 50 may be a lithium-ion battery. As shown in FIGS. 2-4, the positive terminal and the negative terminal of battery 50 is connected both to the output 43 of voltage converter 40 and either the power input 64 of audio amplifier 60 or the input 84 of converter 80. This parallel connection allows both the voltage converter 40 and battery 50 to simultaneously provide current to audio amplifier 60 of a second converter 80.

The rechargeable battery 50 acts as a buffer and as an energy reservoir from which amplifier 60 can draw power as needed—especially during high power transients, without any effect on the power draw from the vehicle's battery 24. Because music is highly dynamic in nature, musical peaks can require as much as ten times more current from an amplifier system's power supply than the average current demand. Without the current system, these peaks must be supplied by the vehicle power source 20. In small vehicles that lack robust electrical systems, such transient, high current or power consumption can be problematic, possibly causing computer glitches, warning lights, and driveability issues. These problems are eliminated with the system shown, especially through the use of a second battery or power storage. The rechargeable battery 50 may have sufficient capacity to power the amplifier for extended periods of time, without any power or current from power source 20.

As discussed above, the capacity of the rechargeable battery 50 is high, such that it is capable of supplying the audio amplifier 60 with all the current it requires, even without the help of the voltage converter 40. The rechargeable battery 50 may be sized such that it can deliver at least five times the current supplied by the voltage converter 40. In addition, the rechargeable battery 50 may include internal control circuitry that includes a sensor that provides a voltage, current, or other signal that indicates or corresponds to a charge or discharge state, which may in turn be used by any part of the system 10 to drive the charge indicator 104, 115, or the discharge indicator 105, 116. The rechargeable battery 50 may also have its own current limit set by the design of the battery's internal control mechanism to protect itself against over-discharge from a malfunction or short circuit condition.

D. Amplifier.

Amplifiers are devices that accept a varying input signal and produce an output signal that varies in the same way as the input, but with a larger amplitude or higher power. An electronic amplifier is a device for increasing the power of a signal, which is typically in the form of a current or a voltage. The amplifier does this by taking power from a power supply and shaping the output to match the input signal (such as an input signal from a head unit or signal source 70). This process invariably introduces some noise and distortion into the signal, and the process is not completely efficient.

Amplifiers are an essential component in car audio applications. A stock vehicle audio system refers to exactly what was specified by the manufacturer when the vehicle, such as a car or boat, was built. A custom vehicle audio installation could include an upgrade of the stock radio, and may also include an upgrade of the amplification system, speakers, power supply system, and other components. One common and familiar piece of audio equipment for vehicles is a signal source such as a radio/tape player/CD player/MP3 player or input for MP3 support, which is generically described as a head unit. Modern head units typically have MP3 support which allows users to play music as desired from a phone or MP3 player through the vehicle sound system, via Bluetooth interface.

In the present system, the first DC/DC converter 40 and the rechargeable battery 50 can be used to drive an audio amplifier 60 that is coupled to a load 30. Amplifier 60 can be any type of amplifier. Amplifier circuits are typically classified as A, B, AB, and C for analog designs, and class D and E for Switching designs. For the analog classes, each class defines what proportion of the input signal cycle is used to actually switch on the amplifying device. Class A amplifiers use the entire input signal. Class B amplifiers use half of the input signal. Class AB amplifiers use more than half of the input signal, but less than all of it. Class C amplifiers use less than half of the input signal.

The audio amplifier 60 has a power input 64 that can be directly connected to the rechargeable battery 50, as shown, for example, in FIG. 2. In other embodiments, the system may include a second DC/DC voltage converter 80, typically a boost converter, coupled to and receiving power from the rechargeable battery 50, the second converter, boost converter 80 coupled to provide power via output 85 to the audio amplifier 60, wherein the power provided to the audio amplifier 60 has a DC voltage greater than a voltage of the rechargeable battery 50. The second boost converter 80 may be a single stage converter, or it may comprise multiple boost stages connected in series, parallel, or any combination of such connections.

As shown in FIGS. 2-6, audio amplifier 60 is configured to consume power from the vehicle power source 20 on a long-term averaging basis, while its peak power needs are met by rechargeable battery 50 and/or voltage converter 40, which can power audio amplifier 60 at the same time as battery 50. This configuration has advantages over conventional systems, such as the system of FIG. 1. For example, in FIG. 1, amplifier 27 uses power from the vehicle power source 20 on an instantaneous basis, since there is no additional energy storage between battery 24 and amplifier 27. Accordingly, electrical power source 20 must be capable of supplying the maximum power required to amplify the peak amplitude of the input signal. In contrast, the inclusion of converter 40 and battery 50 eliminates the need to have a primary power source that can continuously supply the maximum power or current requirements of amplifier 60. Instead, amplifier 60 only requires that power source 20 is able to provide sufficient power to meet its average power requirements, even when peak, momentary requirements are high. As such, the inclusion of battery 50 allows for the use of a more powerful amplifier 60 relative to a vehicle's power source capacity. Amplifier 60 also includes an output 62 that is connectable to a load 30, which are the vehicle's speakers. The system can supply any number of speakers, as is known in vehicle audio systems currently in use.

E. Enclosure.

Figure 7:
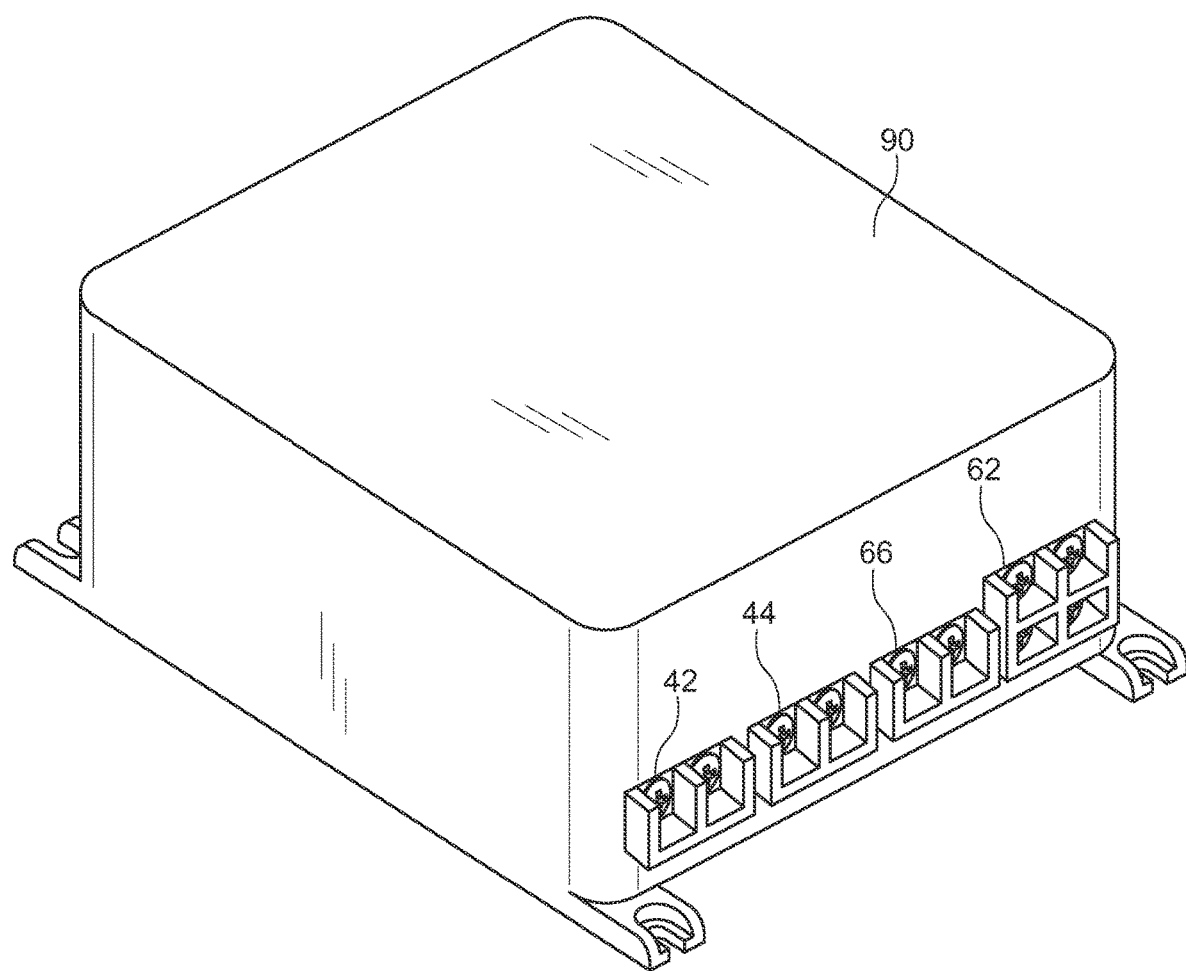
FIG. 7 is a perspective view of a current averaging audio amplifier system in accordance with an example embodiment.

As best shown in FIG. 7, amplifier system 10, or portions of it, may be enclosed in a mechanical enclosure 90. Such enclosures are typically used in vehicle audio systems to protect electronic components from the environment and impacts, etc. Enclosure 90 may include signal and power interfaces as shown, as well as others. For example, enclosure 90 may include terminals or connectors for power input 42, voltage output 44 (from battery 50), signal input 66, and amplifier output 62, which may be an output to drive any number of speakers comprising load 30 of the system 10.

Figure 4A:
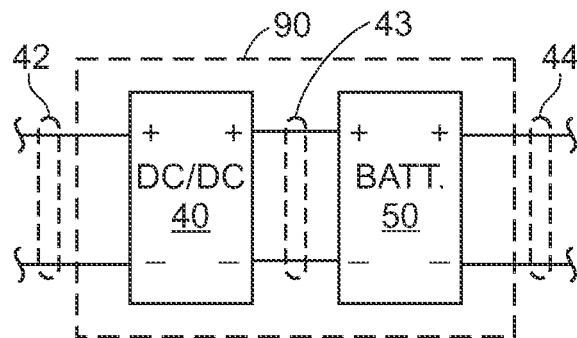
FIG. 4A is a block diagram of a portion of a current averaging audio amplifier system and an enclosure that may be employed in accordance with an example embodiment.
Figure 4B:
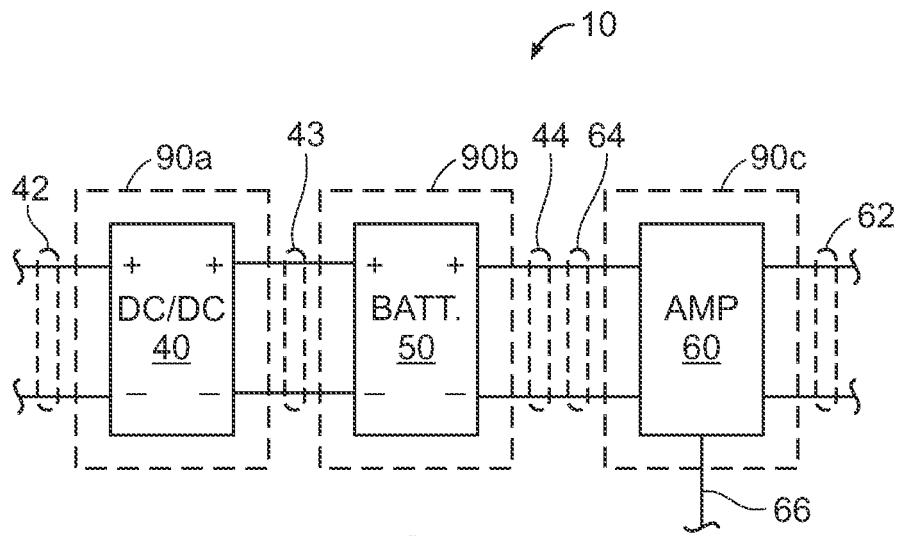
FIG. 4B is another block diagram of a current averaging audio amplifier system and enclosures that may be employed in accordance with an example embodiment.

As mentioned, it is not necessary for all components of the system 10 to be contained within the enclosure 90. For example, as shown in FIG. 4A, the enclosure may be used just for DC/DC converter 40 and battery 50, which would allow the system to provide power to any audio system while still providing the benefits of the system 10. As shown in FIG. 4B, individual components of the system such as DC/DC converter 40, rechargeable battery 50, and amplifier 60 may be contained in separate enclosures 90a, 90b, and 90c, respectively.

Figure 4C:
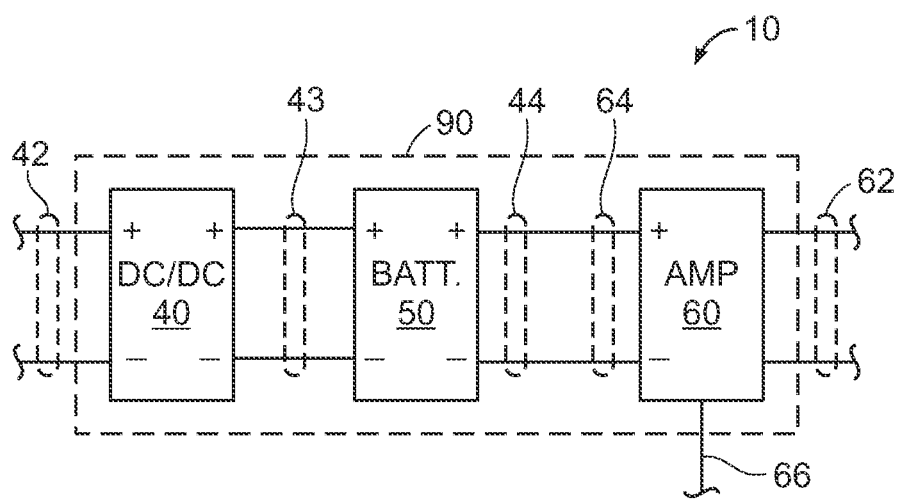
FIG. 4C is a block diagram of a current averaging audio amplifier system and an enclosure that may be employed in accordance with an example embodiment.
Figure 4D:
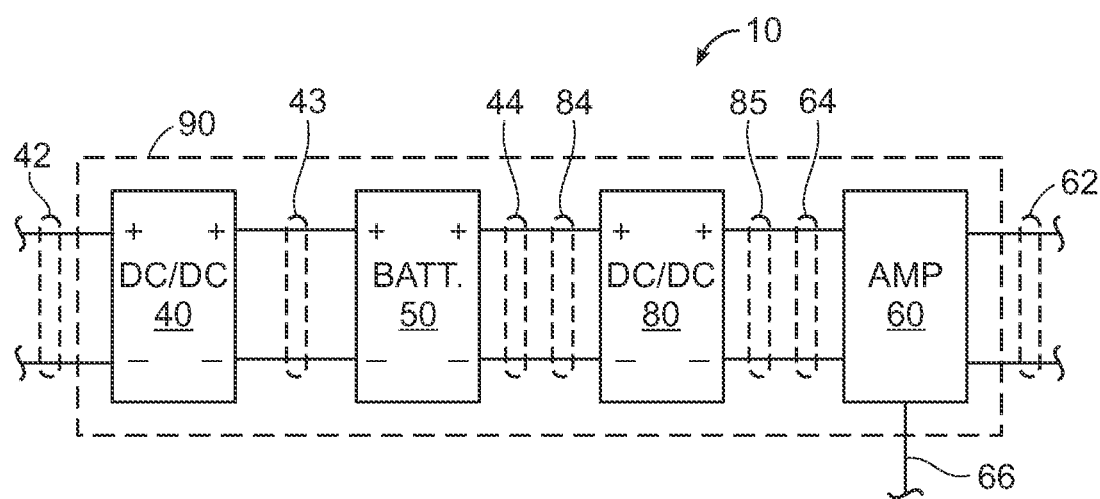
FIG. 4D is a block diagram of a current averaging audio amplifier system and an enclosure that may be employed in accordance with an example embodiment.
Figure 8:
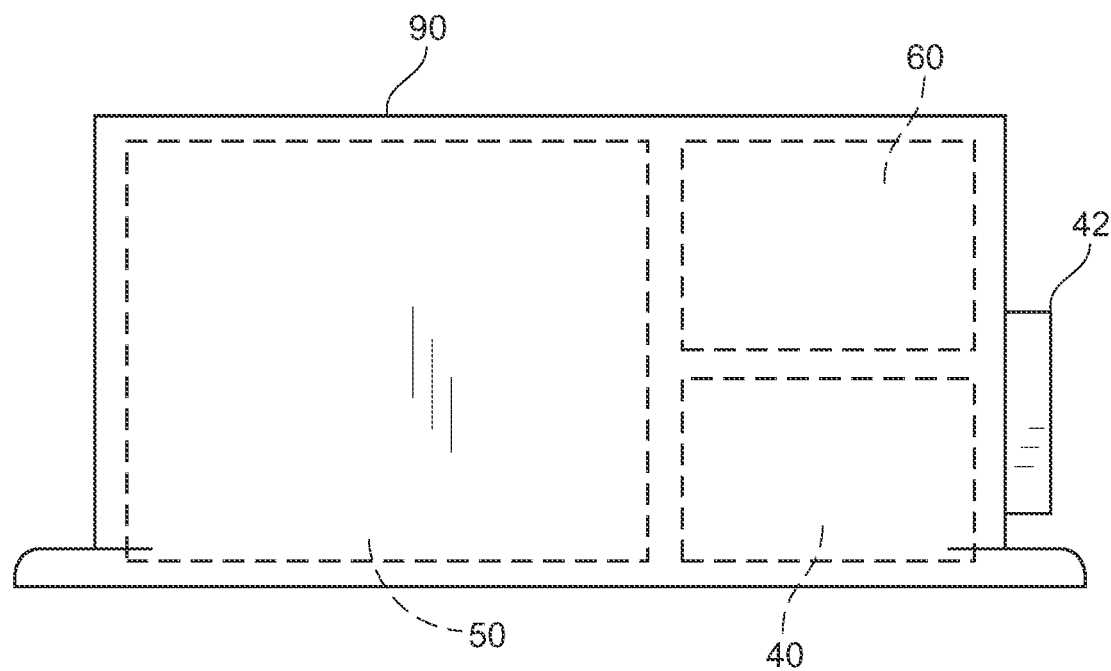
FIG. 8 is a side view of a current averaging audio amplifier system in accordance with an example embodiment.

As shown in FIGS. 4C and 8, DC/DC converter 40, rechargeable battery 50, and amplifier 60 may be contained in a single enclosure 90, and further, in the alternative embodiment that includes a second boost DC/DC converter 80, all of the main components of the system 10 can be included within the enclosure 90, as shown in FIG. 4D. Of course, with different embodiments of FIGS. 4A through 4D, different outputs providing interfaces outside of the enclosure will be needed, and thus the connector/terminal configuration may differ, and include more or fewer inputs/outputs than shown in FIG. 7.

F. Second Boost DC/DC Converter.

The amplification system 10 can be used with or without a second DC/DC boost converter 80 having an input 84, which may be connected to the rechargeable battery 50, and an output 85. The second boost converter 80 may be connected between rechargeable battery 50 and amplifier 60 to provide a higher input voltage to amplifier 60, which in turn makes it easier for the amplifier to provide high transient current to load 30. However, as discussed above, this may not be necessary, depending on the nominal output voltage of rechargeable battery 50. With the use of a second boost converter 80, it is not strictly necessary for the voltage of rechargeable battery 50 to be greater than that of vehicle battery 24 for the system to work. For example, even if the voltages of batteries 24 and 50 are the same or nearly so, the presence of rechargeable battery 50 and DC/DC converter 40 will still provide the isolation and energy storage that results in the advantages described herein. Stated another way, rechargeable battery 50 will still be able to accommodate the peak power and current needs of amplifier 60 without placing an additional burden on power source 20, regardless of the voltage of rechargeable battery 50.

Figure 5:
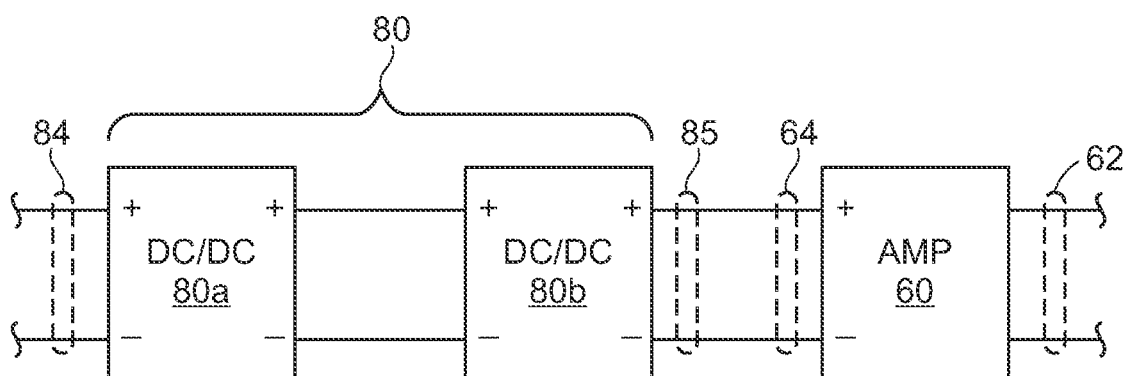
FIG. 5 is a block diagram of a portion of a current averaging audio amplifier system in accordance with an example embodiment.
Figure 6:
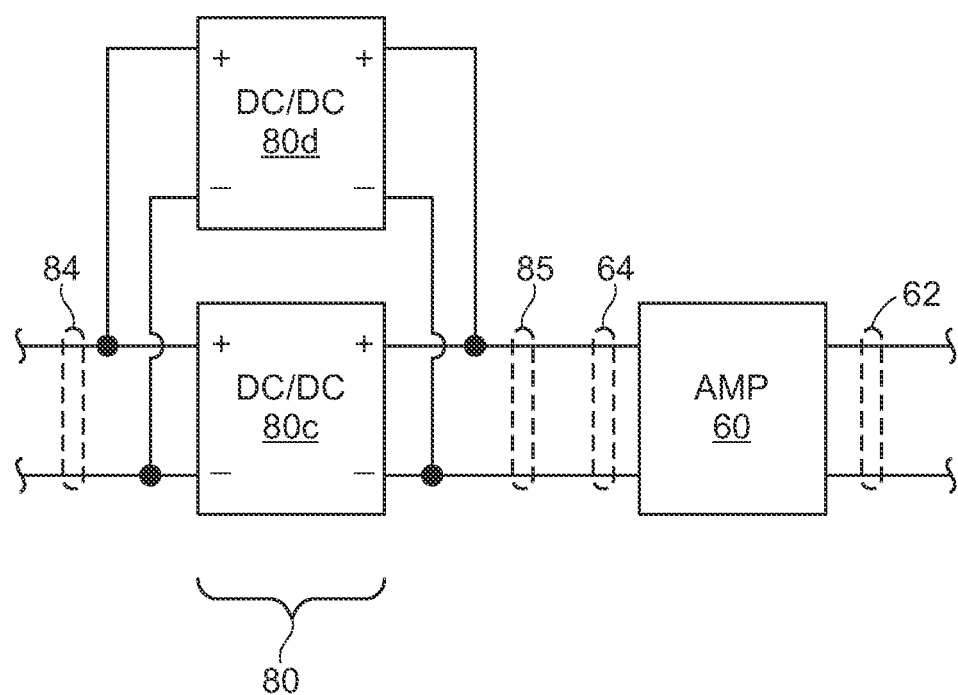
FIG. 6 is another block diagram of a portion of a current averaging audio amplifier system in accordance with an example embodiment.

As shown in FIG. 4D, for example, second boost converter 80 may be comprised of a single boost converter stage, and may have any known circuit topography to provide an increase in voltage between its input 84 and its output 85. Alternatively, the second boost converter 80 may be comprised of two or more DC/DC boost circuits or stages, such as stages 80a and 80b, connected in series, as shown in FIG. 5, with an output 85 connected to input 64 of amplifier 60. In still another possible configuration, converter 80 may be comprised of two or more circuits or stages such as stages 80c and 80d, connected in parallel as shown in FIG. 6, again with output 85 connected to input 64 of amplifier 60. Finally, the second boost converter may be comprised of any number of boost converter circuits configured in any suitable parallel/series combination.

G. Operation of Preferred Embodiment.

In use, amplifier 60 uses current supplied by a vehicle's power source 20, for example, on an averaging basis, due to the constant or limited current draw of DC/DC converter 40. Thus, battery 24 and alternator 22 function as the primary source 20 of power for the amplifier system 10, and specifically, amplifier 60.

Figure 10:
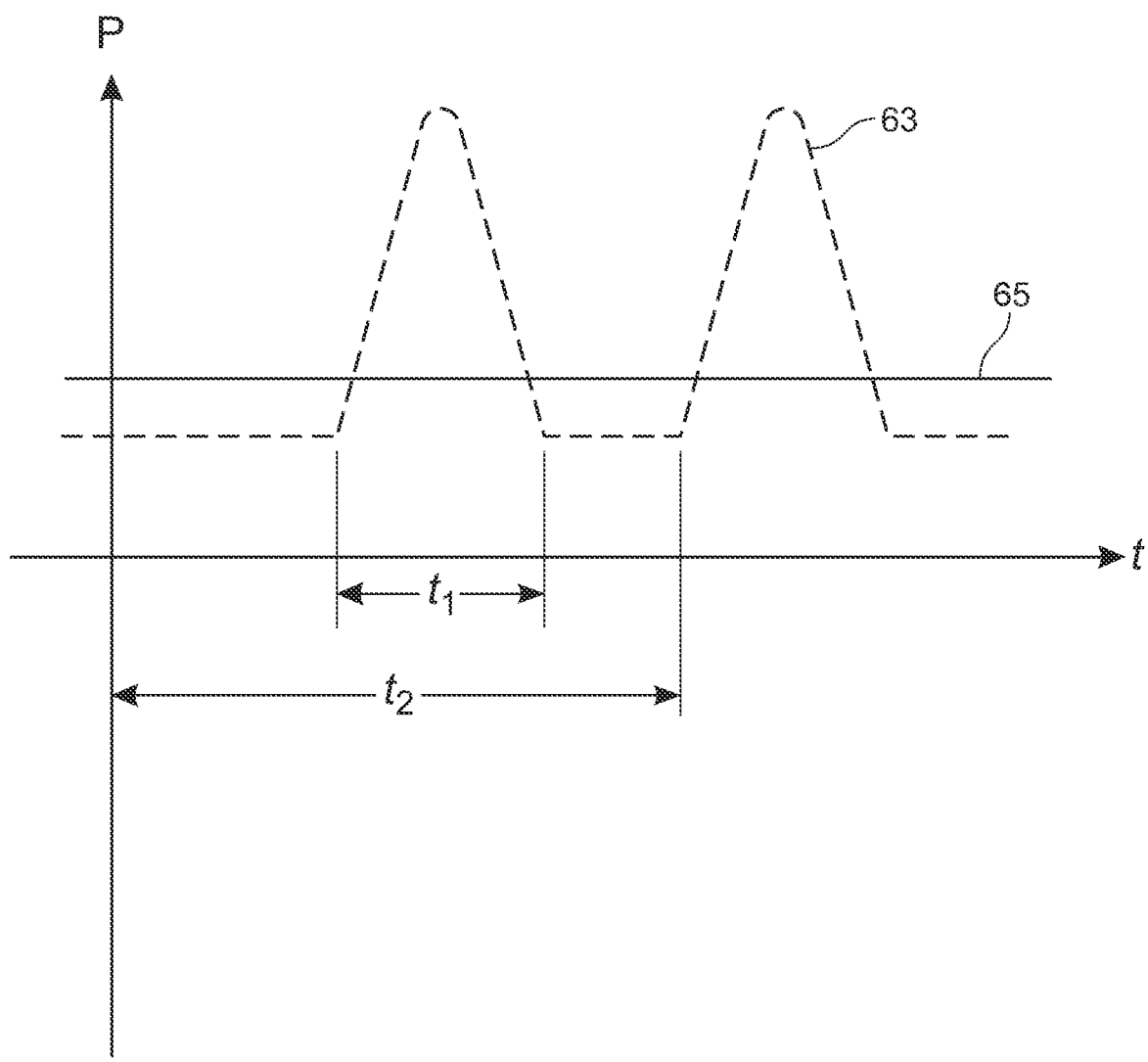
FIG. 10 is a diagram illustrating current and power relationships in a current averaging audio amplifier system in accordance with an example embodiment.

Head unit/signal source 70 provides an electrical signal to amplifier 60 at input 66, and the amplifier provides an amplified input signal to the load 30. Amplifier 60 increases the power of the input signal to drive load 30. During transients, amplifier 60 may require much more power than that supplied by power source 20 from the vehicle. This relationship is illustrated in FIG. 10, which is not necessarily to scale. As shown, over a relatively short finite time interval $t_1$, the power represented by line 63 used by amplifier 60, can easily exceed the power indicated by line 65 supplied by the DC power source 20 to system 10, via input 42 (i.e., the input of DC/DC converter 40). This is normal and expected because the power delivered to the system 10 by DC power source 20 is or can be greater than the power used by the amplifier 60 or load 30 over a longer term average.

The time interval $t_1$ can vary, but due to the relatively high energy density of battery 50 (as selected by a designer based on system requirements), the system's advantages can be realized even when the interval is 0.2 seconds, 0.5 seconds, 1 second, or more.

As also shown in FIG. 10, as the finite time interval increases to length $t_2$ or longer, the power represented by line 63 is, on average, less than the power delivered by DC power source 20, represented by line 65. When the power required by amplifier 60 or, ultimately is less than the power supplied to DC/DC converter 40, the excess power available from DC power source 20 will typically be used by DC/DC converter 40 to charge rechargeable battery 50 until more power is again required by amplifier 60. For example, during the charge period described, if rechargeable battery 50 is significantly discharged, the charge current supplied by DC/DC converter 40 to rechargeable battery 50 may be at its maximum, but this level will still not overtax the DC supply, since the system (and particularly, converter 40) can be designed to provide a limited or constant current. Thus, the power supplied to system 10 by DC power source 20 is the very long term average of the power required by amplifier 60, thus eliminating high peak current and power requirements on the vehicle's electrical power system 20 that a vehicle might otherwise be unable to support. Instead, the high peak power and current is provided by rechargeable battery 50, which is isolated from the vehicle's power system.

Because the voltage converter output 43 is connected in parallel with the terminals of rechargeable battery 50, both will provide current to audio amplifier 60 or one or more additional voltage converters, such as converter 80. The voltage converter 40 has two control set points, one being voltage (i.e., its output), and the other being current. The voltage set point is fixed as part of the converter's design, and as discussed previously, the current is user adjustable. During operation, as the audio amplifier 60 draws current (e.g., from the lithium-ion battery cells in parallel with the voltage converter 40), the current will be shared between the two sources, as follows. Due to the internal resistance of the lithium-ion cells, the voltage from the battery 50 will drop under load as current flows through this internal resistance (IR drop). When this occurs, the voltage converter 40 will deliver more current in accordance with its internal voltage regulator set point. If the current input to the voltage converter 40 is less than the current limit set point, the voltage converter can supply all the current required by the audio amplifier and can also charge the rechargeable battery.

In this condition, the current/power demand of the amplifier 60 will be supplied from the voltage converter 40, and accordingly, the charge indicator 104 or 115 will be on, providing a visual indication that the rechargeable battery 50 is being charged (which also indicates that the current/power demand of amplifier 60 is low relative to the current set point). When the current requirement of the audio amplifier 60 is lower than the current that corresponds to the current that can be supplied by the voltage converter 40 when it is drawing current from the DC power source 20, the charge indicator 104 or 115 will be on, as shown in FIG. 13.

As the current drawn by the amplifier increases further, the current supplied by voltage converter 40 will increase as needed to maintain the voltage at the design point. However, once the input current limit set point is reached, the voltage converter 40 will only deliver a constant current to the battery, and accordingly, the current drawn from the vehicle system will not exceed the set point value. When the current required by the amplifier 60 exceeds the constant current output of the voltage converter 40 (which may be different from the current limit set point), the rechargeable battery 50 will supply additional current to the amplifier to the extent that the requirement exceeds the constant current amount being provided by the converter 40.

In this case, the voltage converter 40 and the rechargeable battery 50 will each deliver a portion of the total current required by audio amplifier 60, and the discharge indicator 106 or 116 will be on. The current sharing will occur naturally since the rechargeable battery 50 and the voltage converter 40 are connected in parallel, and both the converter 40 and the battery 50 can simultaneously supply current/power to the amplifier 60. The operation of the system can be optimized by a user as follows: while loud music is playing, the user can adjust the current limit set point so that the charge indicator 104, 115, and the discharge indicator 105, 116, are each on about half of the total time, in approximately equal time intervals. In practice, the discharge indicator will typically be on momentarily during music peaks, and will go off during lower volume passages, at which time the charge indicator will turn on. This is generally shown in FIG. 13, where the voltage converter 40 is charging the battery 50 about half the time, and where the battery is supplying current to the amplifier, and thus is discharging, about half the time.

Unless otherwise defined, all technical and scientific terms used herein have the same meaning as commonly understood by one of ordinary skill in the art to which this invention belongs. Although methods and materials similar to or equivalent to those described herein can be used in the practice or testing of the current averaging audio amplifier, suitable methods and materials are described above. All publications, patent applications, patents, and other references mentioned herein are incorporated by reference in their entirety to the extent allowed by applicable law and regulations. The current averaging audio amplifier may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

What is claimed is:

1. An audio amplification system for driving a load, the audio amplification system comprising:
  a power input adapted to receive a DC electrical power from a DC power source, the DC electrical power comprising a DC input voltage;
  a voltage converter comprising an output, the voltage converter connected to the power input, such that the voltage converter can receive electrical power from the DC power source, wherein the voltage converter is adapted to draw a limited current from the DC power source, wherein the limited current does not exceed a current limit set point, and wherein the voltage converter produces a DC output voltage at the output;
  a rechargeable battery coupled to the output of the voltage converter, such that the voltage converter is adapted to charge the rechargeable battery; and
  an audio amplifier powered by the rechargeable battery, wherein the audio amplifier is further adapted to be coupled to the load,
  wherein the output of the voltage converter and the output of the rechargeable battery are connected to the audio amplifier such that the voltage converter and the rechargeable battery can both supply power to the audio amplifier,
  wherein the voltage converter is adapted to provide an output current to the audio amplifier such that the voltage converter does not draw current from the DC power source in excess of the current limit set point, and wherein the rechargeable battery is adapted to provide current to the audio amplifier when the current required by the audio amplifier exceeds the output current supplied by the voltage converter, and
  further comprising a charge indicator adapted to provide a charge visual indication in substantially real time when the voltage converter is charging the rechargeable battery.

2. The audio amplification system of claim 1, wherein the audio amplifier is adapted to be simultaneously powered by the rechargeable battery and by the voltage converter.

3. The audio amplification system of claim 1, wherein the voltage converter comprises a boost converter.

4. The audio amplification system of claim 1, wherein the average power supplied to the audio amplifier in a finite time interval is greater than the average power supplied by the DC power source to the power input of the voltage converter.

5. The audio amplification system of claim 1, wherein the average power supplied to the audio amplifier in a finite time interval is less than the average power supplied by the DC power source to the power input of the voltage converter.

6. The audio amplification system of claim 1, wherein the current limit set point is manually adjustable.

7. The audio amplification system of claim 6, wherein the current limit set point is adjustable by a user.

8. The audio amplification system of claim 1, wherein the voltage converter and the rechargeable battery each provide a portion of a total current to the audio amplifier.

9. The audio amplification system of claim 1, further comprising a discharge indicator adapted to provide a discharge visual indication in substantially real time when the rechargeable battery is being discharged.

10. A method of using the audio amplification system of claim 9, comprising:
 receiving the limited current from the DC power source at the voltage converter;
 using the output to provide a charging current to the rechargeable battery;
 using the rechargeable battery to provide power to the audio amplifier; and
 adjusting the current limit set point so that the charge indicator and the discharge indicator provide the charge visual indication and the discharge visual indication in approximately equal time intervals.

11. A method of using the audio amplification system of claim 1, comprising:
 adjusting the current limit set point;
 receiving current from the DC power source at the voltage converter;
 using the output to provide a charging current to the rechargeable battery; and
 using power from the rechargeable battery and from the voltage converter to provide power to the audio amplifier;
 wherein the power supplied to the audio amplifier by the rechargeable battery and the voltage converter can exceed the power supplied by the DC power source for a finite period of time.

12. The audio amplification system of claim 1, wherein the voltage converter is adapted to provide a current to the audio amplifier that does not exceed a maximum current that can be supplied by the voltage converter operating at the current limit set point, and wherein the rechargeable battery is adapted to provide current to the audio amplifier when the current required by the audio amplifier exceeds the maximum current that can be supplied by the voltage converter operating at the current limit set point.

13. The audio amplification system of claim 1, further comprising a control unit adapted to receive a user input to adjust the current limit set point.

14. The audio amplification system of claim 13, wherein the control unit is adapted to receive a user input wirelessly.

15. An audio amplification system for driving a load, the audio amplification system comprising:
 a power input adapted to receive a DC electrical power from a DC power source, the DC electrical power comprising a DC input voltage;
 a first voltage converter comprising an output, the first voltage converter connected to the power input, such that the first voltage converter can receive electrical power from the DC power source, wherein the first voltage converter is adapted to draw a limited current from the DC power source, wherein the limited current does not exceed a current limit set point, and wherein the first voltage converter produces a DC output voltage at the output;
 a rechargeable battery coupled to the output of the first voltage converter, such that the first voltage converter is adapted to charge the rechargeable battery;
 a second voltage converter having an input and an output, the input connected to receive power from the rechargeable battery, wherein the second voltage converter produces an output voltage that is greater than a voltage of the rechargeable battery; and
 an audio amplifier adapted to be powered by the second voltage converter
 wherein the output of the first voltage converter and the output of the rechargeable battery are connected to the audio amplifier such that the first voltage converter and the rechargeable battery can both supply power to the audio amplifier,
 wherein the first voltage converter is adapted to provide an output current to the audio amplifier such that the first voltage converter does not draw current from the DC power source in excess of the current limit set point, and wherein the rechargeable battery is adapted to provide current to the audio amplifier when the current required by the audio amplifier exceeds the output current supplied by the first voltage converter, and
 further comprising a charge indicator adapted to provide a charge visual indication in substantially real time when the voltage converter is charging the rechargeable battery.

16. An audio amplification system for driving a load, the audio amplification system comprising:
 a power input adapted to receive a DC electrical power from a DC power source, the DC electrical power comprising a DC input voltage;
 a voltage converter comprising an output, the voltage converter connected to the power input, such that the voltage converter can receive electrical power from the DC power source, wherein the voltage converter is adapted to draw a limited current from the DC power source, wherein the limited current does not exceed a manually adjustable current limit set point, the manually adjustable current limit set point being adjustable by a user, and wherein the voltage converter produces a DC output voltage at the output;
 a rechargeable battery coupled to the output of the voltage converter, such that the voltage converter is adapted to charge the rechargeable battery;
 an audio amplifier comprising a power input, wherein the output of the voltage converter is coupled to the power input such that the voltage converter can supply power to the audio amplifier;
 a charge indicator adapted to provide a charge visual indication in substantially real time when the voltage converter is charging the rechargeable battery; and
 a discharge indicator adapted to provide a discharge visual indication in substantially real time when the rechargeable battery is being discharged;
 wherein the audio amplifier is further adapted to be coupled to the load to supply power to the load; and
 wherein the average power supplied by the rechargeable battery to the audio amplifier in a finite time interval differs from an average power supplied by the DC power source to the power input of the voltage converter.

17. A method of using the audio amplification system of claim 16, comprising:
 receiving current from the DC power source at the voltage converter;

using the output to provide a charging current to the rechargeable battery;

using current from the rechargeable battery to provide current to the audio amplifier; and adjusting the manually adjustable current limit set point so that the charge indicator and the discharge indicator each provide the charge visual indication and the discharge visual indication in approximately equal time intervals.

\* \* \* \* \*